United States Patent [19]
Kuijk et al.

[11] Patent Number: 6,157,035
[45] Date of Patent: Dec. 5, 2000

[54] SPATIALLY MODULATED DETECTOR FOR RADIATION

[75] Inventors: Maarten Kuijk, Antwerp; Paul Heremans, Leuven; Daniel Coppee, Schoten; Roger Vounckx, Schaarbeek, all of Belgium

[73] Assignee: IMEC, Leuven, Belgium

[21] Appl. No.: 09/070,095

[22] Filed: Apr. 30, 1998

[30] Foreign Application Priority Data

Apr. 30, 1997 [EP] European Pat. Off. .............. 97870061
May 29, 1997 [EP] European Pat. Off. .............. 97870076

[51] Int. Cl.$^7$ .................................................. H01L 27/14
[52] U.S. Cl. ............................... 250/370.14; 250/370.01; 257/435
[58] Field of Search .................... 250/370.01, 370.14, 250/395, 336.1, 338.4, 338.1, 208.2, 214 R, 214 RC, 252.1 R; 257/428, 435

[56] References Cited

U.S. PATENT DOCUMENTS

| | | |
|---|---|---|
| 4,096,512 | 6/1978 | Polinsky . |
| 5,130,775 | 7/1992 | Maeda et al. . |
| 5,451,769 | 9/1995 | McAdoo et al. . |
| 5,625,729 | 4/1997 | Brown . |
| 5,841,126 | 11/1998 | Fossum . |

FOREIGN PATENT DOCUMENTS

| | | |
|---|---|---|
| 421 403 | 10/1991 | European Pat. Off. . |
| 2324651 | 10/1998 | United Kingdom . |

OTHER PUBLICATIONS

Ayadi, Kamel et al., "A Monolithic Optoelectronic Receiver in Standard 0.7 –$\mu$m CMOS Operating at 180 MHz and 176–fJ Light Input Energy", *IEEE Photonics Technology Letters*, vol. 9, No. 1, Jan. 1997, pp. 88–90.

Levine, B.F., et al., "1 Gb/s Si High Quantum Efficiency Monolithically Integrable $\lambda$=0.88 $\mu$m Detector", *Applied Physics Letters*, vol. 66, No. 22, May 29, 1995, pp. 2084–2986.

*Primary Examiner*—Constantine Hannaher
*Assistant Examiner*—Richard Hanig
*Attorney, Agent, or Firm*—Knobbe, Martens, Olson & Bear, LLP

[57] ABSTRACT

A novel radiation detector, a detection principle and an associated structure are provided for semiconductor substrate detectors in general and for CMOS based circuits in particular. For an optical detector, photons absorbed in the neutral zone of the substrate generate electron hole pairs that migrate by diffusion. A shadow mask gives a spatial modulation to the incident, and consequently, to the absorbed light in the semiconductor substrate. By measuring the magnitude of the spatial frequency component in the minority carrier distribution with a spatial frequency corresponding to that of the shadow mask, a fast detector is conceived. A shadow mask with higher spatial modulation frequency delivers a faster turn-off. The combination of a plurality of these detectors with an image fiber forms a basic system for constructing high-speed parallel optical interconnects between chips.

23 Claims, 13 Drawing Sheets

SPATIALLY MODULATED DETECTOR FOR RADIATION

BACKGROUND OF THE INVENTION

1. Field of the Invention

The invention relates to the field of detection of radiation in a semiconductor substrate. More in particular, the present invention is related to a time-differentiated measurement of the spatial modulation of carriers generated by radiation and diffusing in the substrate.

2. Description of the Related Art

Devices receiving light at high speed in specially conceived receiver photo-diodes constructed in, for example, silicon or in III-V semiconductor material are known in the art. The acquired information stream is often further processed or used in CMOS or BICMOS circuitry. This approach requires hybridization of the receiver (or of the receiver diodes) with the CMOS (or BICMOS) circuitry. This lowers system yield and adds significantly to the cost of the system. When constructing, for example, parallel optical interconnects between CMOS circuits, there is a need for light sources and for light detectors. Large numbers of detectors need to be connected to the CMOS circuitry, which is difficult to achieve. Detection of the light directly in CMOS avoids most problems associated to hybridization, including cost and reliability.

However, it is known that light detection directly in CMOS yields low detector-response times. As stated by Levine et al. in "1 Gb/s Si high quantum efficiency monolithically integrable 880 nm detector", Applied Physics Letters vol. 66 p.2984, 1995, a typical response time is 200 ns. The same publication shows operation at a higher frequency (1 Gb/s) by deviating strongly from standard CMOS concepts.

A typical problem when using the neutral zone in the semiconductor substrate for constructing a direct light receiver system is that the attainable bit error rate is bad (high) due to photo-generated carriers diffusing around in the substrate for as long as their lifetime, depending on previous light-input patterns. However, by operating differentially, it has been proven very recently by Ayadi et al.: "A Monolithic Optoelectronic Receiver in Standard 0.7-$\mu$m CMOS Operating at 180 MHz and 176-fJ Light Input Energy", IEEE Phot. Techn. Lett., vol. 9, 88–90, 1997 that faster operation is possible using a mere CMOS based detection system. The solution being disclosed by Ayadi requires, however, two light input channels, which is not practical for many communication applications.

U.S. Pat. No. 4,096,512 discloses a light detector which employs two interdigitated PN junction light detectors, one of which is covered by an opaque material. The one covered by opaque material is used as a standard for eliminating dark current effects. This document teaches how to cancel the dark current of a photo-detector, but does not teach how to speed up photo-detector response. In order to eliminate insensitivity due to high "dark current", this document uses two interdigitated relatively large area PN junctions, one of which is covered by an opaque material. The result is that the two PN junctions will have closely matched dark currents one of which can be used as a reference for determining the current due exclusively to illumination on the other. As a result of the opaque layer, the leakage current measured between the two conductors is representative of the "dark current" for the device formed by the region uncovered and the substrate as well as for the device formed by the covered region and the substrate. The leakage current of the device formed by the covered region and substrate can be subtracted by an external circuit from the leakage current of the device formed by the uncovered region in the substrate. This means that there is an unmasked detector and a reference detector. The reference detector only has a dark current. The dark-current is generally known to be only function of temperature and metallurgical junction quality, and is hence a DC value (except for very slow variations with temperature). Using the teaching of this document, no faster detector response will be obtained by subtraction of the dark currents. Since subtracting with a DC-value does not change timing behavior, it only gives an offset.

AIMS OF THE INVENTION

It is a first aim of the present invention to provide a radiation detection device that allows detecting single channel radiation input at high speed in semiconductor based detectors, such as detectors achievable in standard CMOS.

It is a further aim of the invention to provide a radiation detector with fast response and fast turn-off times.

It is a further aim of the invention to provide a detection device whereby photo-generated carriers from the substrate are used as input signal without lowering the bit error rate.

It is a further aim of the invention to provide a device whereby the method of detecting light consists in creating a spatial modulation of the photo-generated carriers by a shadow mask, and by measuring this spatial modulation of photo-generated carriers.

It is a further aim of the invention to provide a light detecting principle that is insensitive to charge carriers diffusing in the substrate, allowing the packing of such detectors very densely at low spacing and with low crosstalk.

It is a further aim of the invention to provide a light detector in standard CMOS technology, that is very compact, and that, due to large packing density of these detectors forms with image fibers a basic building structure for parallel optical interconnects between chips.

It is a further aim of the invention to provide a detection device whereby photo-generated carriers from the substrate are used as input signal and whereby at the same time high power supply rejection ratio is obtained.

SUMMARY OF THE INVENTION

The present invention is related to a detector for radiation with a timedependent amplitude, comprising:

- a semiconductor substrate wherein said radiation is being absorbed, the radiation being absorbed in said substrate being spatially modulated such that said radiation thereby creates at least a first signal and a second signal in said detector; and
- a frequency-sensitive circuit for comparing the time behavior of said first and said second signal to thereby define a detector output signal.

Advantageously, said radiation has at least a MHz frequency and said detector output signal has at least a MHz frequency.

Preferably, said radiation creates charge carriers in said substrate, the density of charge carriers being generated in said substrate by said radiation being modulated according to a spatial mask blocking a region of said substrate such that said radiation is substantially attenuated in said region.

Said spatial mask has at least one radiation blocking part and at least one radiation passing part.

Advantageously, the radiation blocking parts and the radiation passing parts are alternating.

The detector according to the invention can further comprise:

at least one first region and at least one second region in said semiconducting substrate, said first and said second region being adapted for collecting charge carriers being generated in said substrate and in said regions by said radiation, said mask substantially blocking the generation of said charge carriers in said second region, the charge carriers being generated in said substrate by said radiation and being collected in said second region thereby essentially being charge carriers having diffused to said second region; and said circuit being connected to said first and said second region, and wherein the charge carriers being generated in said first region have a first response and the charge carriers being generated in said second region have a second response, said circuit having a functionality of comparing the time behavior of said first and said second response.

Said second response is preferably subtracted from said first response, the resulting pulse being processed in peripheral circuitry.

According to a preferred embodiment, said first region and said second region are forming diodes with said substrate, said substrate having dopants of one conductivity type, said first region and said second region having dopants of another conductivity type.

As a second object, the present invention is related to a method for detecting high-frequency radiation in a detector being integrated in a substrate having at least a first region and a second region, comprising the steps of:

covering said second region with a mask substantially blocking said radiation;

collecting in said first region charge carriers being generated in said first region and said second region by said radiation, thereby creating a first signal;

collecting in said second region charge carriers being generated in said substrate by said radiation, said mask substantially blocking the generation of said charge carriers in said second region whereby the charge carriers being collected in said second region essentially are charge carriers having diffused to said second region, thereby creating a second signal; and subtracting in a frequency-sensitive circuit said first signal from said second signal.

Thus, a novel radiation detector, a detection principle and an associated structure are provided for semiconductor substrate detectors in general and for CMOS based circuits in particular. For an optical detector, photons absorbed in the neutral zone of the substrate generate electron hole pairs that migrate by diffusion. A shadow mask gives a spatial modulation to the incident, and consequently, to the absorbed light in the semiconductor substrate. By measuring the magnitude of the spatial frequency component in the minority carrier distribution with a spatial frequency corresponding to that of the shadow mask, a fast detector is conceived. A shadow mask with higher spatial modulation frequency delivers a faster turn-off. The combination of a plurality of these detectors with an image fiber forms a basic system for constructing high-speed parallel optical interconnects between chips.

Thus, the detection system has two detector contacts: the immediate detector contact comprises a direct time response, and the deferred detector contact gives a time response from diffusing carriers in the substrate. These diffusing carriers originated from light, and can therefore not be regarded as a "dark-current".

BRIEF DESCRIPTION OF THE DRAWINGS

FIGS. 2A–B is a schematic representation of a preferred embodiment of the invention for illustrative purposes with:

Figure 3:
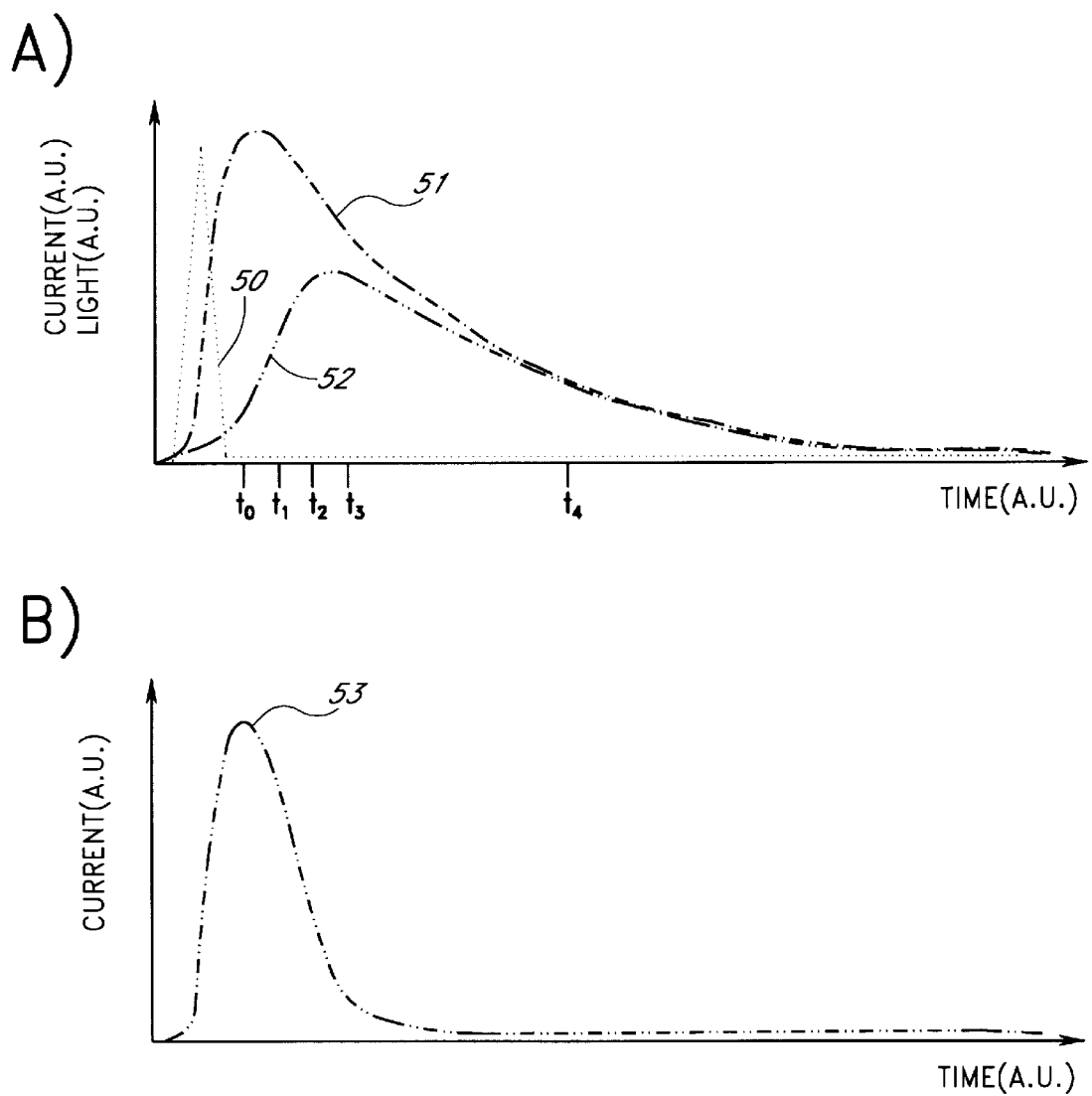

A) the cross-section of the detector showing the spatial dependency of the absorbed carriers (zones 21 . . . 23) just after light absorption; immediate or direct detector regions located in the illuminated area and deferred detector regions located in the shadow of the shadow mask and B) spatial minority-carrier density at five moments in time, $t_0, t_1, t_2, t_3,$ and $t_4$ (32 . . . 36) demonstrating decay and diffusion of minority carriers;

FIG. 3A illustrates the current versus time response to a light input pulse 50 at the immediate or direct detector region (current 51) and at the deferred detector region (current 52) of the detector of preferred embodiment of the invention; moments in time $t_0, t_1, t_2, t_3,$ and $t_4$ are indicated, FIG. 3B illustrates the difference 53 between currents 51 and 52;

FIGS. 4A–C represent

A) a preferred layout showing the immediate detector region 71, the deferred detector region 70 and the shadow mask 72 in intermixed finger shape;

B) a circular layout with the immediate detector region 74, the deferred detector region 75 and the shadow mask 73 in concentric circles;

C) a circular layout with the immediate detector region 77, the deferred detector region 76 and the shadow mask 78 in two concentric zones.

Figure 5:
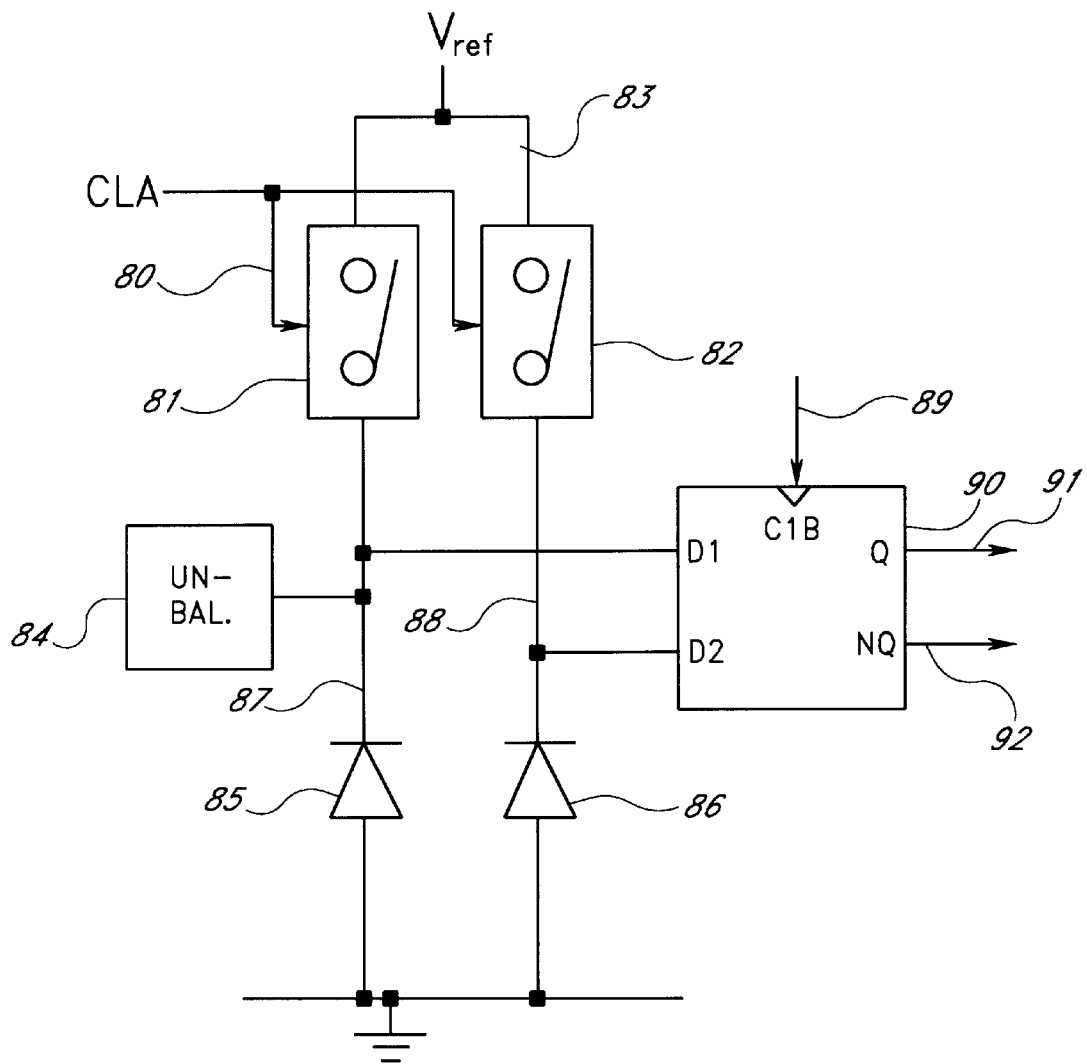

FIG. 5 represents the preferred circuit for a digital synchronous receiver including a clocked sense-amplifier.

Figure 6:
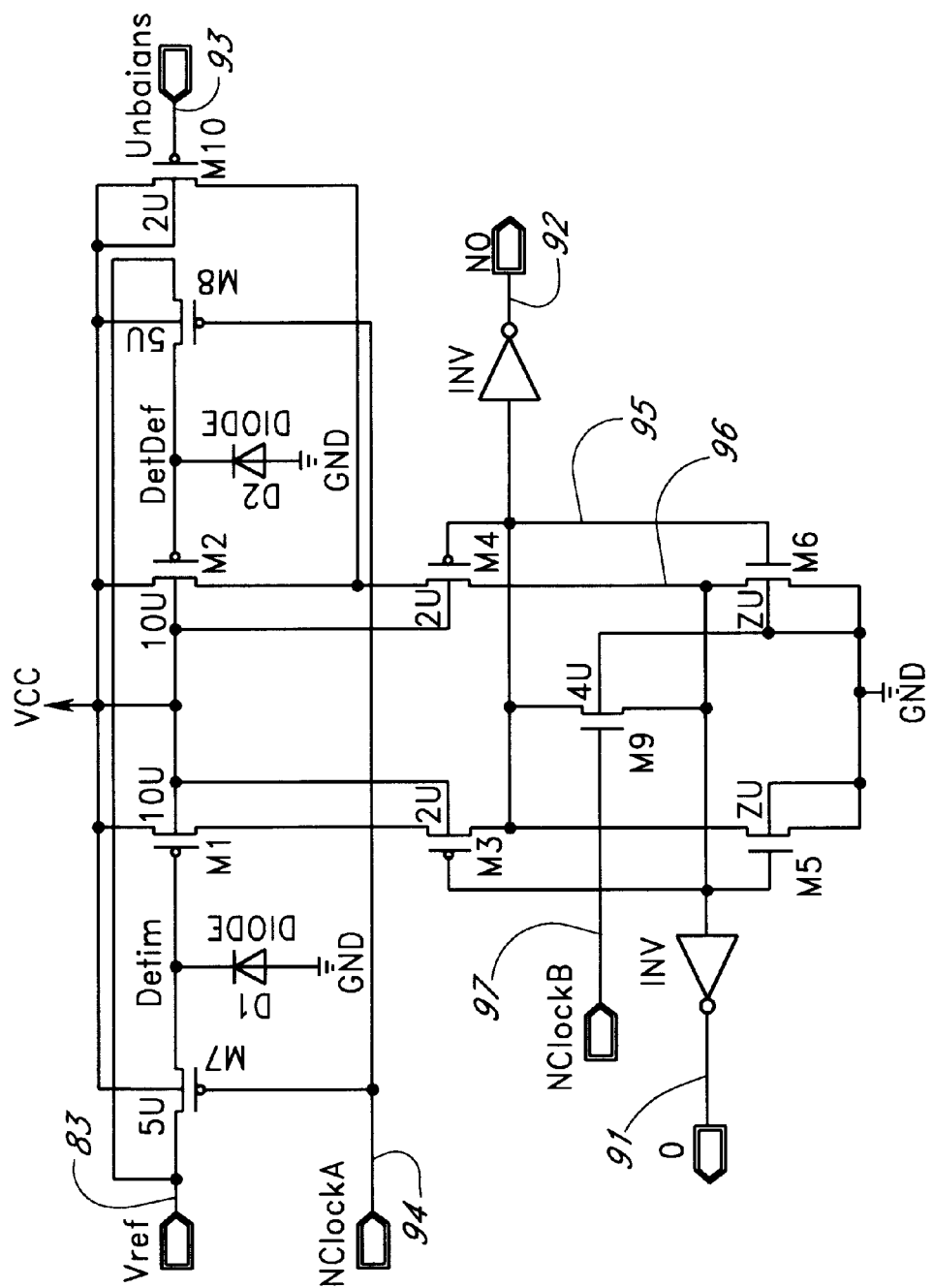

FIG. 6 represents a detailed implementation of a digital synchronous receiver following essentially the scheme of FIG. 5.

Figure 7:
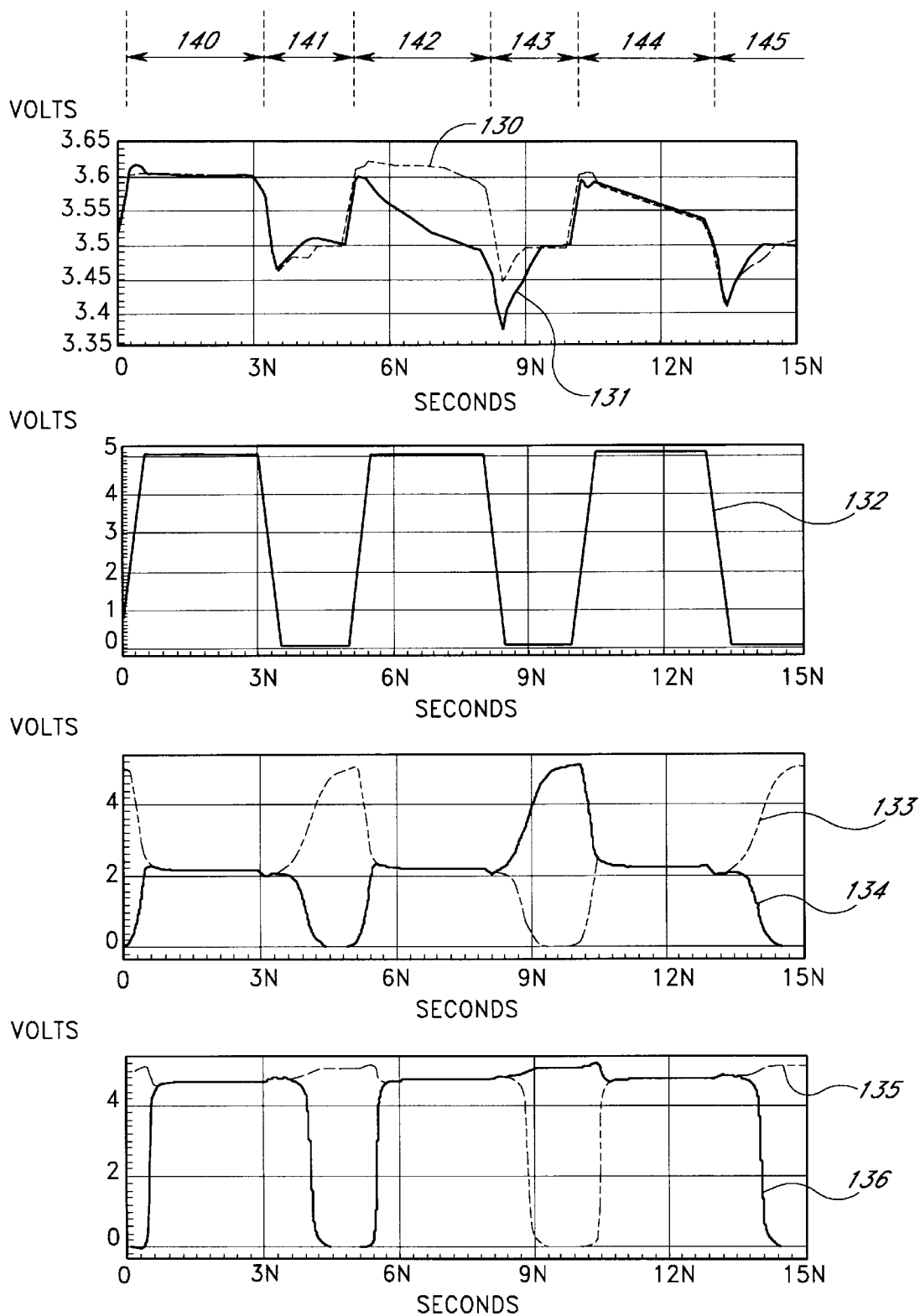

FIG. 7 represents a Spice simulation of the circuit of FIG. 6.

Figure 8:
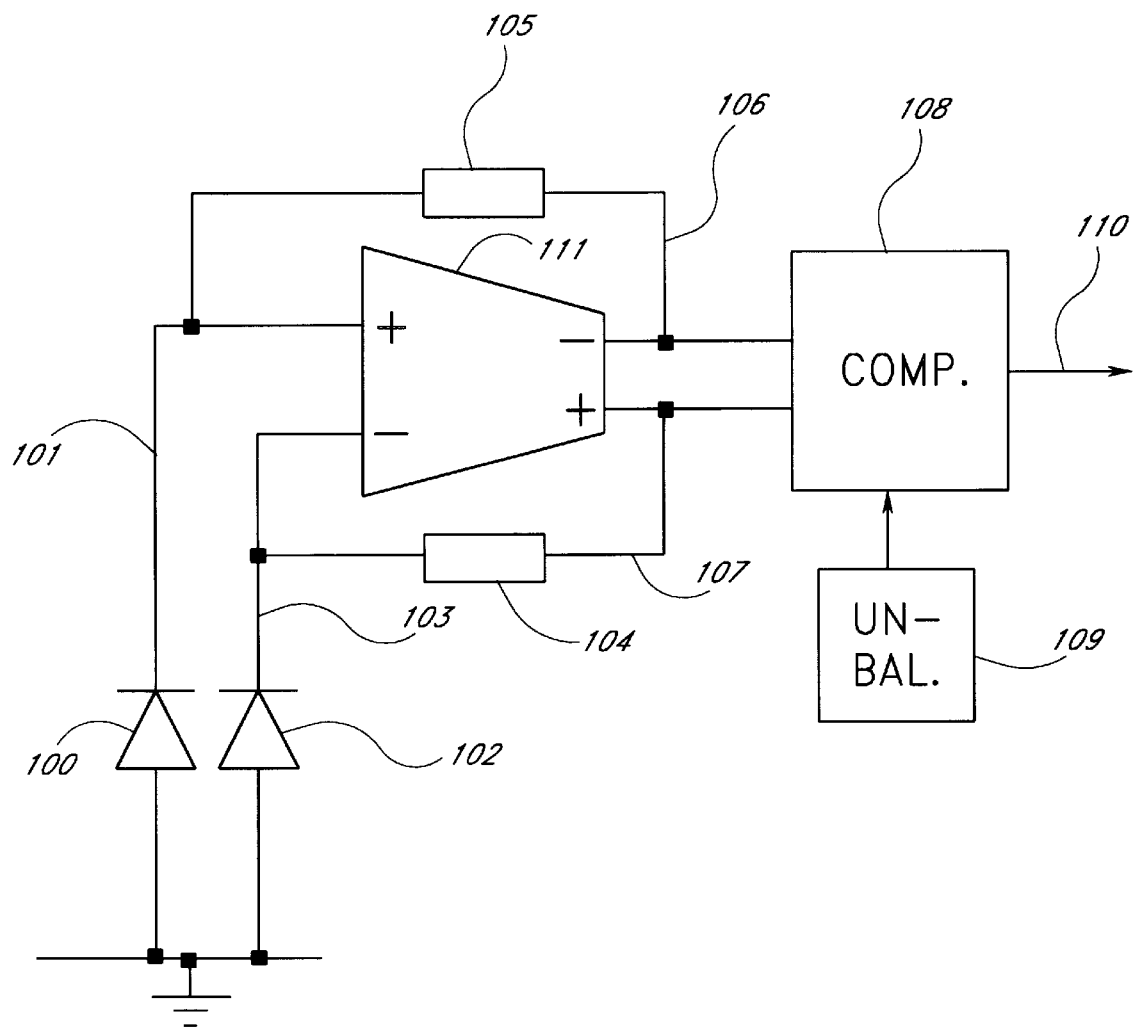

FIG. 8 represents the preferred circuit for a digital receiver with asynchronous preamplifier and connected comparator.

Figure 9:
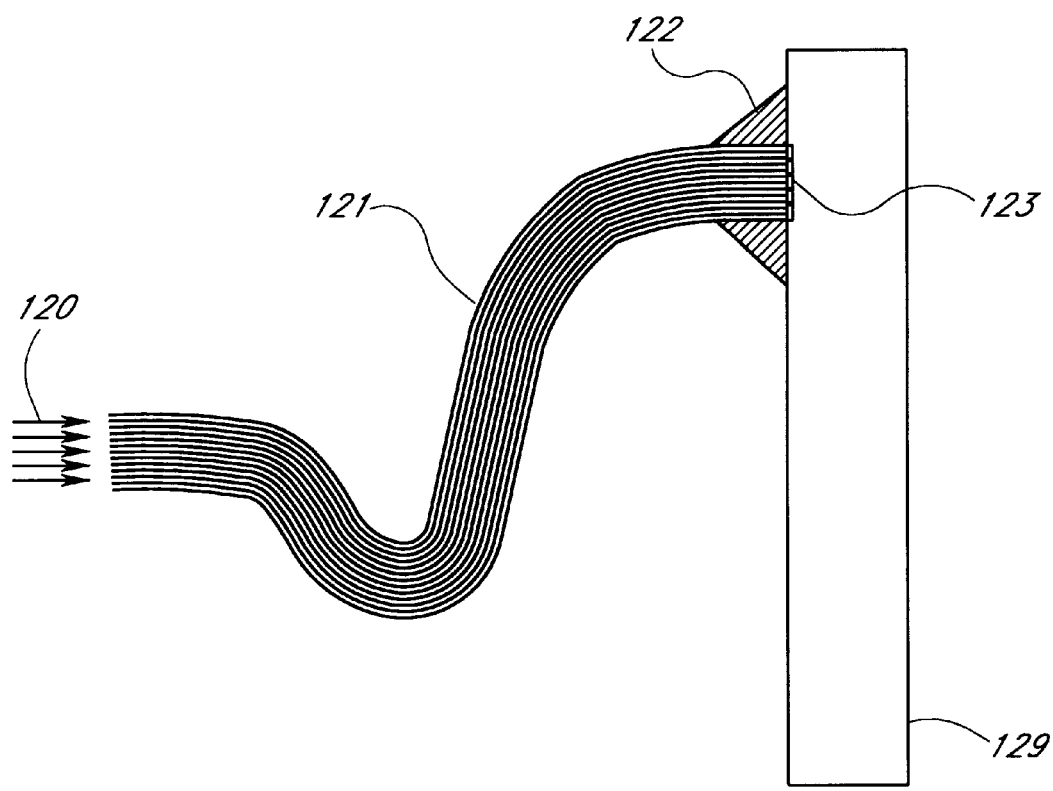

FIG. 9 represents a preferred system for parallel optical interconnects including an image-fiber abutted to an array of detectors of the type of the present invention.

Figure 10:
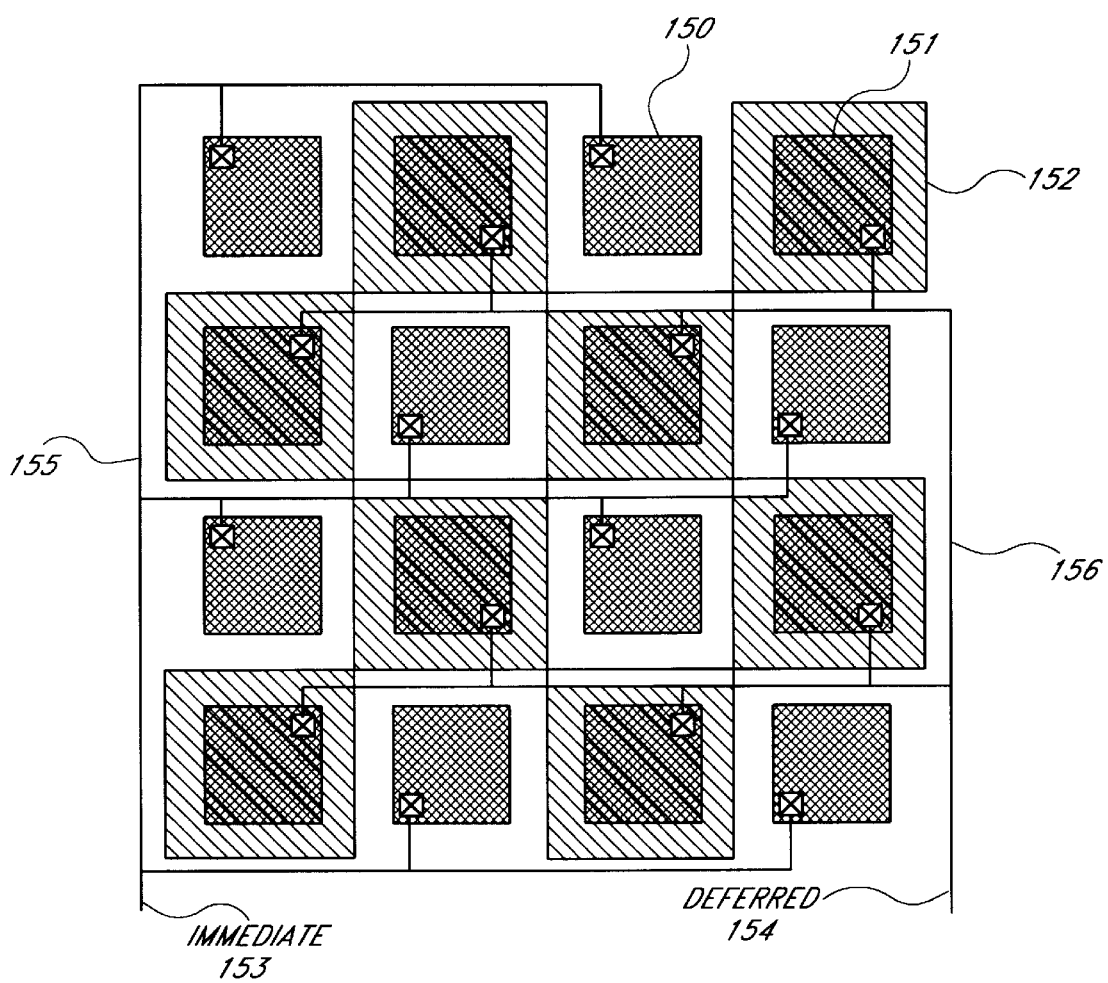

FIG. 10 represents a preferred layout of immediate (150) or direct and deferred (151) detector regions in chessboard topology.

FIGS. 11A–C represent three ways to increase the responsivity of the detector of the invention by redirecting radiation incident on the blocked regions:

A) the preferred method, i.e. by a roughened surface;

B) by micro-lenses; and

C) by a grating.

Figure 12:
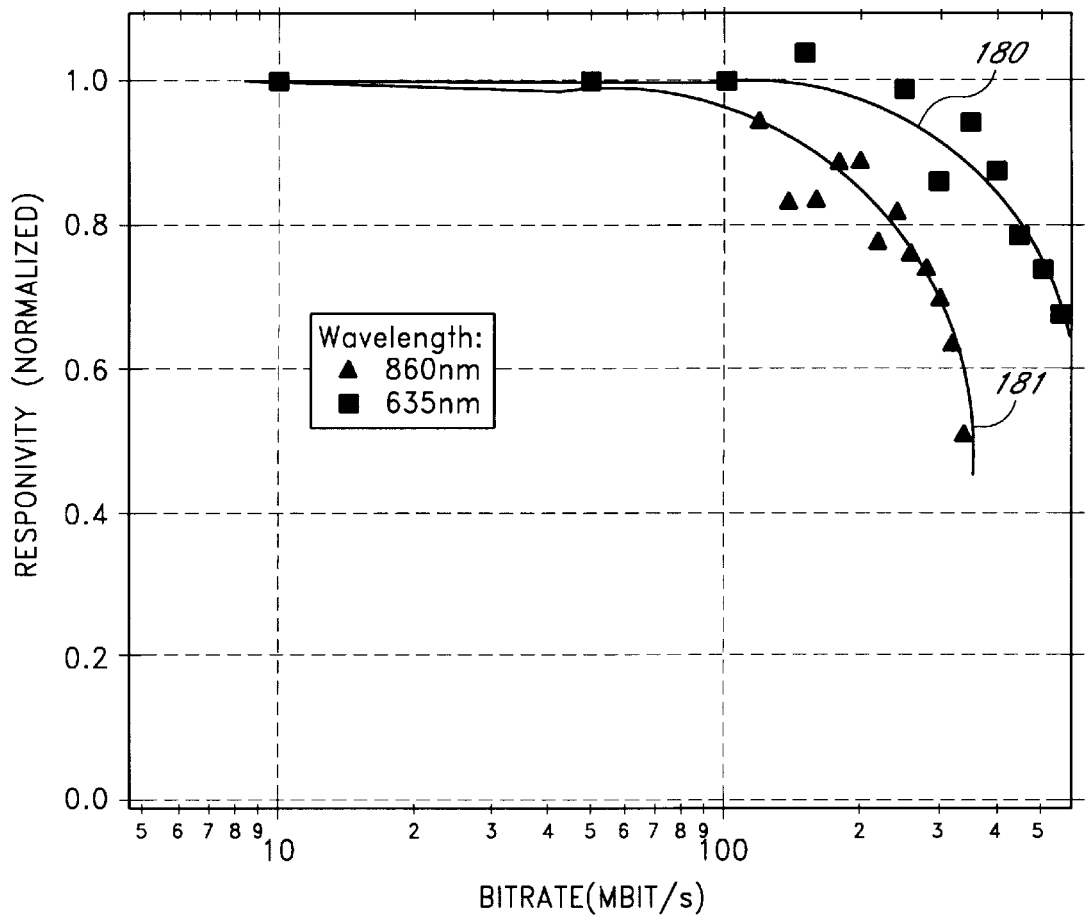

FIG. 12 shows a measurement of the responsivity versus bit rate with the detector according to a preferred embodiment of the present invention.

Figure 13:
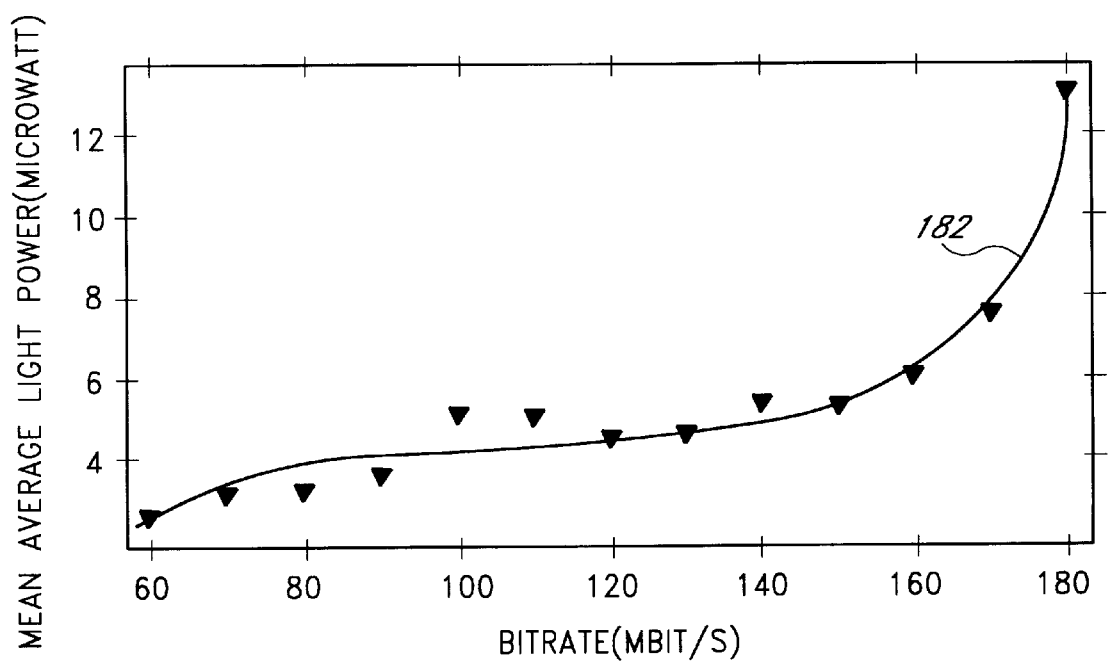

FIG. 13 shows the measured average light power versus bit rate of the synchronous receiver monolithically integrated with the detector according to a best mode implementation of the present invention.

DETAILED DESCRIPTION OF A PREFERRED EMBODIMENT OF THE INVENTION

In the detailed description of the invention, the explanation is limited to light detection in chips made by a standard CMOS process with single N-well technology. With this description, the person skilled in the art can extend the use and the merits of the present invention to other technologies such as p-well, dual-well and BICMOS technologies. Several layouts and construction methods for a robust and fast substratedetector are included. The combination with image fibers delivers a system that is ideally suited for parallel optical interconnects.

Figure 1:
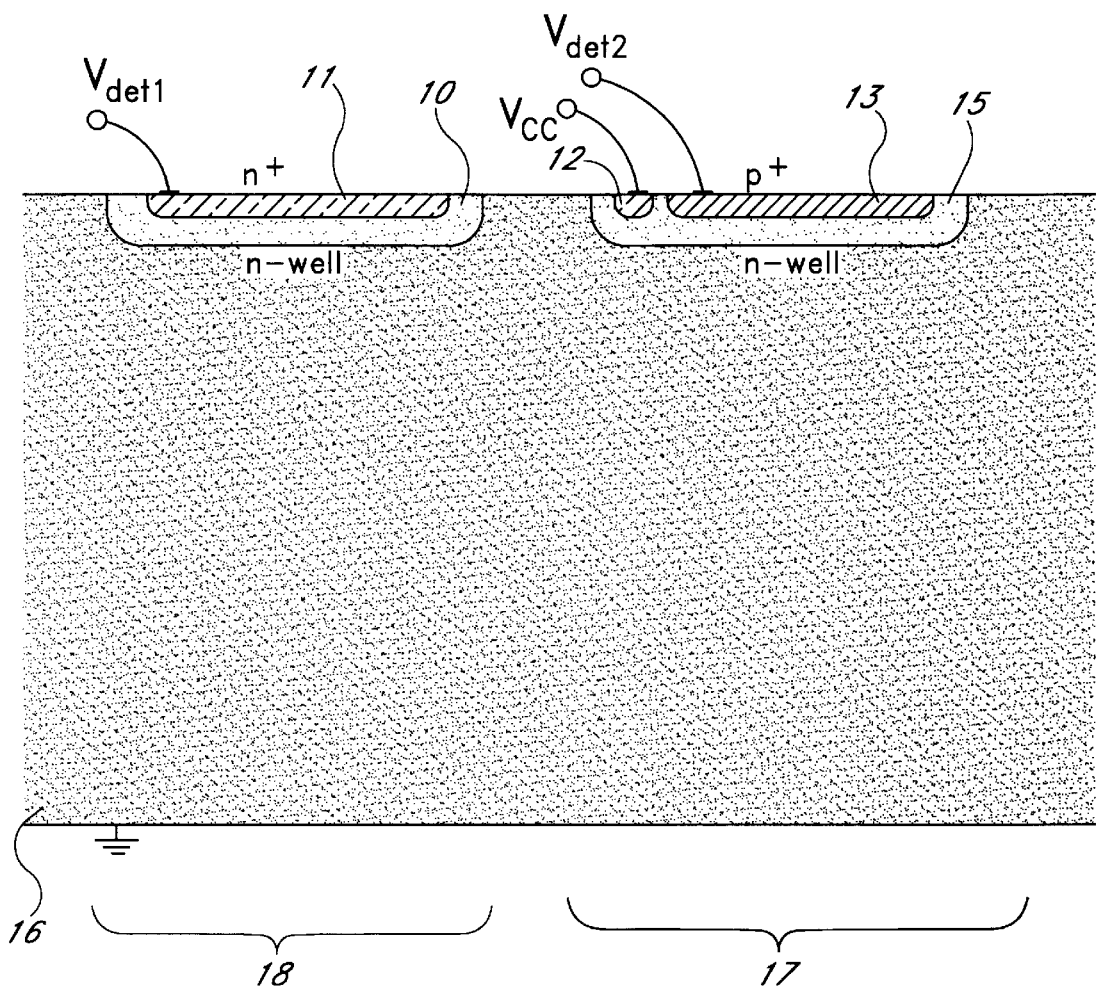
FIG. 1 illustrates single n-well CMOS technology, a substrate cross section whereby in part 18 an n-well 10 forms with the substrate 16 a photo-diode, and in part 17 an n-well 15 forms with the $p^+$ layer 13 a photo-diode not sensing the carriers photo-generated in the substrate 16.

To focus on the difficulties to detect light in standard CMOS, FIG. 1 is given. The construction of n-well, and highly doped $n^+$ and $p^+$ regions are included in the definition of the process. We assume the substrate to be lightly p-doped. Usually, the $n^+$-regions serve as drain and source regions for the NMOS transistors, and as strap to contact n-wells. Conversely, the $p^{30}$-regions usually serve as drain and source for the PMOS transistors and as strap to the substrate.

In FIG. 1, the configuration at the right 17 could serve as a detector. The n-well 15 is biased at a fixed voltage, for example at the $V_{cc}$ by strap 12. This n-well forms together with the upper thin $p^+$ region 13 a photo-diode. The anode, region 13, is the floating terminal, and the cathode region 15 is fixed. When light is incident on this construction, electron-hole pairs will be generated in the regions 13, 15 and in the substrate 16. A part of the light-generated carriers in the substrate will diffuse to the junction between region 15/16. Approximately the half of the photo-generated carriers in region 15 will diffuse to junction 15/16, the other half to junction 13/15. Most of the photo-generated carriers from layer 13 will arrive at the junction 13/15. Terminal $V_{det2}$, will sense only the carriers arriving at the junction 13/15. Carriers arriving at the junction 15/16 are not sensed, since this junction is AC short-circuited. In this way, carriers absorbed in the substrate 16 do not add to the detector signal. For future technologies with smaller feature size, the n-well is thinner, and therefore fewer absorbed carriers will be contributing to the detector signal. In summary, using this way of detection results in low quantum efficiency.

On the other hand, one can consider using the photo-generated carriers from the substrate. This is illustrated in FIG. 1, by the construction on the left-hand side 18 using an n-well 10, and a $n^+$ region 11. The detector junction is formed at the interface of the substrate 16 and the region 10. Region 11 facilitates connection to terminal $V_{det1}$, and lowers due to its higher doping the square-resistance of the region 11 in parallel with region 10. The carriers which will contribute to the photo-current of this detector (and hence to the voltage $V_{det1}$) are photo-generated in the n-well 10 or in the substrate 16. The system shows better quantum efficiency than construction 17 at the right, however it has a slow response. Moreover a problem is that it also senses photo-generated carriers from neighboring detector regions, or any minority carrier coming from whatever source. Other detector set-ups, sensing diffusive carriers in the substrate can be configured by the person skilled in the art, or are known in literature. Leaving out n-well 10 is an option. In that case, only $n^+$ region 11 is collecting carriers from the substrate. Another option is to use a set-up whereby parasitic CMOS bipolar transistors are included.

The preferred embodiment of the invention is described now in detail.

Figure 2:
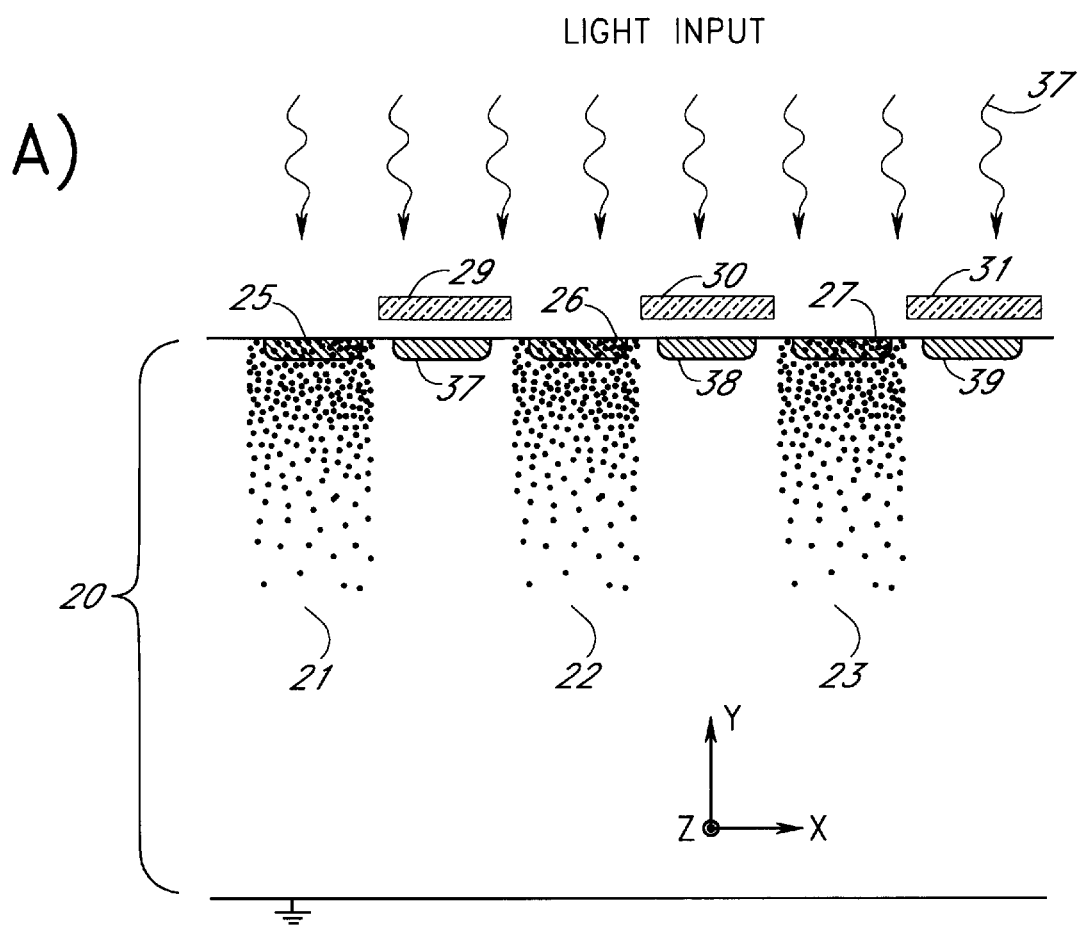
Figure 2:
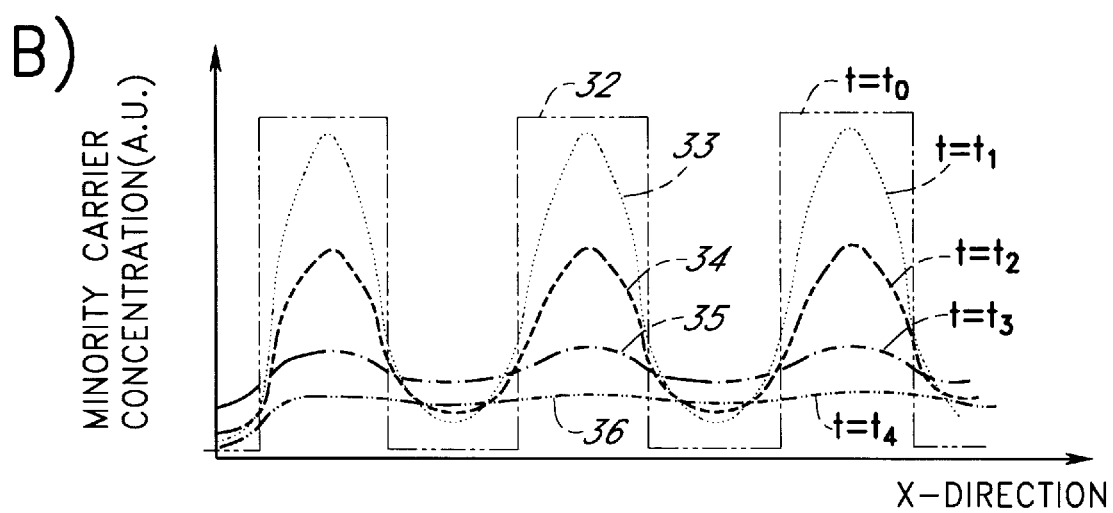

In FIG. 2A, regions 25,26,27 and 37,38,39 are detecting regions which are intended to detect minority carriers including minority carriers coming from the substrate. The incident light is partly blocked by several opaque elements 29, 30 and 31 forming a shadow mask. Consequently, the density of photo-generated carriers is modulated in correspondence with said shadow mask. Numbers 21, 22, and 23 refer to the clouds of photo-generated carriers, being present immediately after the absorption of an infinitesimal short light pulse.

FIG. 2B shows the density of photo-generated carriers versus the X-direction, in a plane below the surface in the neutral zone of the substrate. We assume that the incident light consists of a short light pulse given just before $t_0$. At $t_0$, curve 32 gives the distribution of the minority carriers, in response to the light pulse. The modulation depth of this curve is essentially 100%. When time passes, the distribution becomes less pronounced and the modulation depth decreases due to the diffusion of the carriers in all directions. This is illustrated by curves 33, 34, 35 and 36 at moments $t_1, t_2, t_3, t_4$ respectively. At moment $t_4$ the modulation on the carrier density has disappeared almost completely.

The mean value of the minority carrier density also lowers versus time, due to several mechanisms. Firstly, carriers disappear at the detectors since they are collected there. Secondly, carriers disappear by recombination and thirdly, the carriers spread out over a much larger region than the region of the detector.

In FIG. 3A, curve 50 shows the light pulse reaching its maximum just before $t_0$. The current through the illuminated detection regions 25,26,27 versus time is given by curve 51. The response time of detectors using the substrate for carrier collection in general is essentially the same. A typical problem herewith is the slow turn-off speed. The current through the shadowed detection regions 37,38,39 is represented by curve 52. It responds with some latency to the light pulse, since carriers have to diffuse to reach these regions. The turn-off is essentially the same as the turn-off on curve 51. We define the illuminated detector regions 25,26,27 as the immediate or direct detector or detector region, and the shadowed detector regions 37,38,39 together as the deferred detector or deferred detector regions.

When the area from the immediate or direct and the deferred detector regions are the same, the tails of curves 51 and 52 will fall together from the moment that there is no modulation depth in the minority carrier density. This is essentially from moment $t_4$ on. However, from moment $t_3$ on, the spatial modulation is already very low, and the difference between the curves 51 and 52 is consequently small too.

By subtracting the curve 51 from 52, curve 53 is constructed. The turn-off tail of constructed curve 53 decays much faster than the turn-off tail from curve 51. Consequently, the width of the pulse 53 is much shorter, and the total response speed is increased significantly.

This way of sensing is very robust. The relation between diffusion distance l and time t after an event of carrier creation (like absorption of light) is the following:

$$l = \sqrt{D.t},$$

with D the ambipolar diffusion coefficient. After, for example, a time of 3 ns, electrons in a lightly p-doped substrate (assuming an ambipolar diffusion coefficient of 38.8 cm$^2$/V/s) will have diffused over a mean distance of 3.4 µm.

A distribution of carriers given at a certain moment in time, will diffuse when time advances. A way to calculate the distribution versus time is to convolute the initial distribution with a gaussian distribution, with a sigma parameter that essentially equals $\sqrt{2.1}$. With the present invention one has to measure only the magnitude of a higher spatial frequency component in the carrier distribution. To generate a higher spatial frequency component in the photo-generated carrier distribution, the preferred method is to work with a shadow mask as stated before. The detector response is now defined by the magnitude versus time of the spatial frequency component in the minority carrier distribution whose spatial frequency corresponds to the shadow mask.

Consequently, an infinitesimal short incident light pulse will deliver a detector response pulse of which the width can be tuned by the choice of the spatial frequency of the shadow mask. A high spatial frequency of the shadow mask layer gives a shorter response, and lower spatial frequency of the shadow mask delivers a longer response pulse. A longer response pulse gives, integrated over time, a larger signal since photo-generated carriers from deeper regions in the substrate are included in the detected signal current.

When carriers are coming from a neighboring receiver, they will not be carrying spatial information since the time to travel is much longer than the time the carriers can retain their spatial information. This delivers a very high immunity to cross-talk with neighboring detectors, and to minority carriers having diffused or wandering around in the substrate. Electron-hole pairs generated by incident α-particles will not generate a high spatial carrier distribution, therefore against this phenomenon there is certain immunity expected. Substrate detectors not using the principle of the present invention will collect the α-particle generated carriers and interpret it as incident light.

Figure 4:
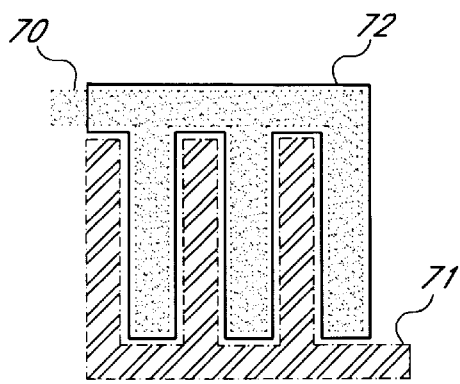
Figure 4:
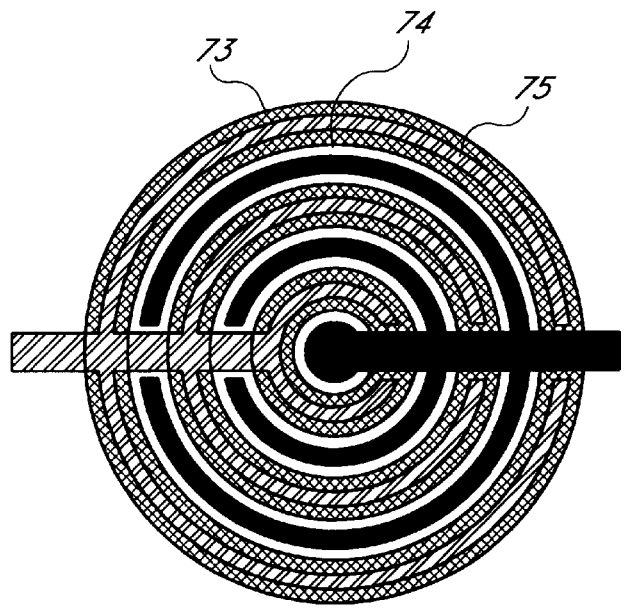
Figure 4:
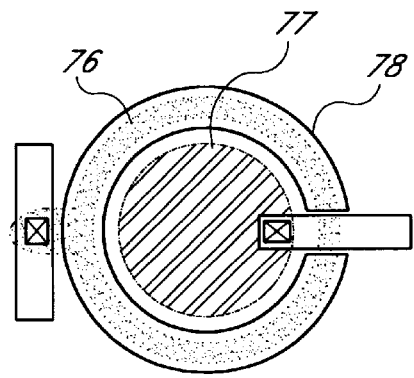

FIG. 4 gives possible ways to layout the detector regions following the present invention. Using a fingered pattern for the immediate detector region 71, a region 70 for the deferred detector region, and a shadow mask 72, preferentially opaque, on top of region 70. The response from regions 70 and 71 will be subtracted in circuitry located preferentially very near to this construction. A faster detector is achieved by using smaller fingers for the three regions 70, 71 and 72. When a larger detecting area is preferred, the finger pattern can be extended in any direction to suit the designers need. Although in FIG. 4A, there is only one immediate-detection region, one deferred-detection region and one shadow region, one could speak of multiple alternating regions. At the sides, the regions are connected. It is the effective alternation in light blocking and light passing regions being present which allows the detector to work properly. A round detector with paralleled circular detector regions is shown in FIG. 4B as reference. Region 74 serves as the immediate detector region, and region 75 as the deferred. The subtraction of both region signals gives the useful detector signal. Region 73 is the shadow mask region.

A very simple set-up can deliver a measure of the spatial distribution of the light generated carriers, as shown in FIG. 4C. Light applied to the center area will be sensed by the immediate detector 77, and the deferred signal at detector region 76 is to be subtracted from it. The set-up of FIG. 4C limits the detection area to a certain size for a given detector speed. For some applications, including receivers for monomode fibers, this can suffice.

It should be noted, that the immediate and the deferred detector may have different areas. In that case the subtraction is replaced by a weighted subtraction in the subsequent signal processing. In other words, the difference in detector area is taken carefully into account. The preferred set-up is to design the areas to be the same, and also, to design the same capacitance for both the immediate and the deferred detector. The fingered set-up of FIG. 4A is therefore preferred above the circular construction of FIGS. 4B and 4C.

Having the same capacitance for both detector areas makes the subsequent analog signal processing simpler and more robust.

The light input pattern having an intended spatial frequency can be created by a shadow mask, by a grating or another optical system. The preferred method is the use of one of the metal layers available in the CMOS process. This does not require any extra processing steps or an optical system keeping the cost of the system low. The shadow mask can be part of the definition of a standard cell.

The above explanation about operation concerns the light impulse response of the proposed system. It should be noted however, that when having the impulse response of the system, the response to any light input pattern could be calculated (assuming linearity). In this way it can be proven that a continuous light input also gives a considerable output signal. The only restriction is at the high frequency end, when expecting output pulses shorter than the impulse response pulse. The output pulse cannot get any shorter than the impulse response pulse width of the system, as is the case in any linear system.

The subtraction is the most straightforward way of generating the signal that is in proportion to the modulation of the photo-generated carrier density. FIG. 5 shows the preferred circuitry for a digital synchronous receiver. Diode 86 and 85 represent the immediate and the deferred detector respectively. The voltage on their cathode nodes 88 and 87 can be reset by switches 82 and 81 to a reference voltage $V_{ref}$ from node 83, in response to a clock signal C1A 80. If immediate detector 86 receives light, its cathode voltage 88 versus time will decrease faster than the cathode voltage 87 on deferred detector 85. When no light is incident, the voltage on both cathode nodes 87 and 88 will remain the same, or decrease simultaneously due to diffusive carriers (from previous light inputs) reaching both detectors equally. The unbalance block 84 is intended to give a difference in the opposite direction than when detecting light. It can give a small decrease in voltage on the deferred detector 85. In this way, when no light is incident, detector signals are different, instead of equal. When a light pulse impinges, its signal should be large enough to be stronger than the imbalance generated by block 84. The sense-amplifier 90 will amplify the difference in voltage on nodes 87 and 88 very strongly (at the moment demanded by signal 89), such that at its outputs 91, 92, a digital result of the operation is given. The outputs 91,92 deliver digital information for further use on the CMOS chip. When output 91 is high, a light pulse was detected, when output 91 is low, no light pulse has been detected. Output 92 is optional, giving the inverse of the output of 91.

The total structure of FIG. 5 forms a digital light receiver using a single light channel, however with a differential readout principle. The differential readout gives a strong immunity to peaks typically present on the power supply nodes in digital circuits. Since these peaks equally affect both detectors and both sides in the senseamplifier, the influence here from is limited.

FIG. 6 is a preferred implementation in standard 0.8 micron CMOS technology of the circuit schematically represented by FIG. 5. Transistors and technology allow light reception at 200 MHz rate. Higher speed requires smaller size technology. All NMOS and PMOS transistors have 0.8 micron gate length, except PMOS transistor M10 having a gate length of 10 micron. The widths of the gates of the transistors are indicated in FIG. 6. Immediate detector diode 86 is named D1, deferred detector diode 85 is named D2. Reference voltage Vref 83 is imposed on diodes D1 & D2 by switches 82 and 81, in FIG. 6 by PMOS transistors M7 and M8 respectively, when NclockA 94 is in a digitally LOW state (0 V).

Transistors M1 to M6 and M9 form the sense-amplifier 90 represented in FIG. 5. NClockB 97 resets the state of the sense-amplifier when in a digitally HIGH state. When NClockB 97 goes low (falling edge) a comparison occurs between the voltage levels on the two detector cathodes D1 and D2, taking into account an unbalance current injected in the sense-amplifier by transistor M10. The exact level of unbalance can be tuned by tuning the voltage level on node Unbalans 93. In FIG. 5, the unbalance 84 is imposed on detector node 87. In FIG. 6, the unbalance is imposed inside the sense-amplifier at the drain of transistor M2. In the latter way, the unbalance is independent of the duration that NclockA is in a digital HIGH state. The result of the comparison is read out at complementary outputs 91 and 92 as long as NclockB 89 remains in a digitally LOW-state.

FIG. 7 gives the Spice simulation of the circuit from FIG. 6 whereby the clock signals 97 and 94 are tied together, forming a single clock, further called the clock signal. The capacitance of the immediate and the deferred detector are assumed to be both 100 fF. The reference voltage Vref is 3.5 V, the Vcc power supply voltage is 5 V. The unbalans voltage at terminal 93 is chosen at 3 V.

The voltage applied to the clock is shown by curve 132. When the clock is HIGH (periods 140, 142 & 144), the system is sensitive to incident light. During these periods, the detectors accumulate all detected carriers on their cathodes, lowering the voltage on the cathode nodes. Curve 131 represents the voltage on the cathode of the immediate detector, curve 130 on the deferred detector. Also during these periods the sense-amplifier is reset, which can be seen on curves 133 and 134 that represent the voltage on the internal switching nodes 96 and 95 of the sense-amplifier. When the clock is in the digital LOW state (periods 141, 143 and 145), the sense-amplifier amplifies the difference of voltages on the detector, (after being transformed to currents through M1 and M2), into digital voltage levels. Through transistor M10, the current intended to give a controlled imbalance (via terminal 93) is also included in this evaluation. During these periods 141, 143 and 145, the voltages on the detector diodes are forced to Vref, which is chosen in this simulation to be 3.5 V. The voltage on the detectors are in this way reset to a common starting position ready to receive a following bit.

During period 140 no carriers are collected at either detector diodes. Curves 130 and 131 remain constant. During the evaluation period 141, the voltage on node 96 increases (curve 133) and the output 91 goes digitally LOW (curve 136). The complementary output 92 remains digitally HIGH (curve 135). During period 142, carriers are detected at the immediate detector (simulating light input), lowering the voltage at the cathode of the immediate detector. Voltage 131 therefore lowers significantly. During the subsequent evaluation (period 143), it is decided that light was incident, resulting in a HIGH output state on terminal 91 (curve 136), and a LOW output state on output 92 (curve 135). During subsequent period 144, no light is incident. However, carriers from the previous cycle are still wandering around, and are being detected in both the deferred and the immediate detector. Due to this, the voltages across both detectors (curves 131 and 130) decrease at the same rate. During the evaluation (period 145), it is decided that no light was incident, resulting in a LOW output state on terminal 91, and a HIGH output state on output 92.

Depending on the exact use of this circuit, it is decided to use a single, or two separate clocks. With repetitive synchronous bit detection, it is preferred to use the option of the single clock for simplicity reason.

FIG. 8 demonstrates the preferred way to obtain a digital asynchronous light receiver. A fully differential OTA or OPAMP 111 is configured such that it forms together with impedances 105 and 104 a differential trans-impedance amplifier, featuring high power-supply noise-immunity. The difference in voltage on the output nodes 106 & 107 is in proportion to the difference in current through the immediate detector 100 and the deferred detector 102. A comparator 108 will measure whether the difference is larger than a given imbalance 109 to distinguish between HIGH and LOW at its output 110.

The preferred circuits of FIGS. 5 and 8 subtract the signals from the immediate and the deferred detector in an indirect way. In the circuit from FIG. 5, the difference is blown-up to a digital signal on clock 89 demand. In the circuit of FIG. 8, the voltage difference between nodes 107 and 106 is a direct measure for the difference in current from the immediate and the deferred detector.

DESCRIPTION OF SEVERAL POSSIBLE APPLICATIONS OF THE INVENTION

Image fibers, well known from medical imaging, and used among others in endoscopes, transport an image from one place to another with a one to one correlation between light input and light output image. Arrays of detectors of the present invention can be spaced very densely, in arrays on a pitch of 50 micron or even less. FIG. 9 shows how such array of detectors formed together with an image fiber a basic structure for a parallel optical interconnect. By abutting the image fiber 121 even without lenses or tapers to the array of substrate detectors 123 on the CMOS chip 129, the parallel optical interconnect is formed. Glue or adhesive 122 forms a means to fabricate a solid construction. The person skilled in the art of chip packaging knows which glue can be used, and how alignment can be obtained.

For serial interconnects, the detector can be used in many applications, especially those where POF (plastic optical fibers) fibers are used as the light-guiding medium. Wavelength of light used in POF applications is typically 860 nm or even 635 nm (red) because absorption in the POFs is too high at standard (longer) communication wavelengths. In both cases, the detector of the present invention will perform well, as demonstrated by the measurements. Therefore, the present detector can be used in serial optical interconnect applications, by simply abutting the POF-fiber to the detector. A lens may be used to concentrate the light from the fiber on a smaller detector. The CMOS detector/receiver chip can carry any amount of receiving electronics used in the subsequent stream of information processing. In this way, the detector leads do not have to pass over an MCM or Printed Circuit Board, giving additional noise pick-up, and additional parasitic capacitance. This leads to improved detector readout voltages with lower noise and to a total lower system cost.

A pick-up head for CD-ROM and Digital Disk reader (DVD reader) includes several photo-detectors. These detectors allows to generate a feedback signal for lens positioning, allows to adjust the head position, and to receive the high bitrate optical data stream from the disk. Separate integrated circuits connected via (flexible) printed circuit boards collect the detector signals, and process them.

With the present invention, these detectors can be grouped on one CMOS chip together with analog processing functions and possibly digital signal processing circuitry. The presence of a preamplifier monolithically integrated with the detector allows to achieve a low capacitance on the detector node(s). Better detector-receivers combinations, being faster and/or more sensitive, become achievable. At least, the production cost can be decreased significantly by using this CMOS option.

Opto-couplers, commonly used for galvanic insulation, can be improved considerably by the use of the present invention. Usually, an opto-coupler consists of a LED focused on a phototransistor. To generate a clear digital signal, it is hereby expected that the Printed Circuit Board (PCB) contains one or more extra components. With the present invention, the receiver side can be implemented in CMOS together with the light detector. Moreover, the receiving CMOS chip can include a conversion to digital signals for further use on a printed circuit board. This includes conversion to TTL or CMOS levels. Circuitry to drive transmission lines can be included for high speed operation or to drive longer transmission lines. Such extra functionality lowers the number of components to configure an electronic system. With an amplifying receiver, a lower light level in the opto-coupler can suffice. This lowers the required drive current of the LED at the sending side, to below the mA level. Low power opto-couplers can be achieved in this way, at a low cost. The high-speed qualities of detectors of the present invention used in such opto-coupler system will be useful for the present and future bit rate speeds.

A preferred layout of the detector regions is presented in FIG. 10 in a chessboard pattern. Regions of immediate detector region 150 and deferred detector region 151 are alternating in the X and Y directions, the deferred being shadowed by a mask (masking region 152 for deferred detection region 151). These regions are preferentially squared; however, they can also have different shape, including rectangular. The masking regions must cover the deferred detector regions. To get an immediate detector contact 153, and a deferred detector contact 154, another metal level available in standard CMOS design should be used as wiring means. For example, one can use metal for the wiring, and metal2 for the shadow mask. In FIG. 10, a possible wiring layout is shown by the solid lines 155 and 156 connecting all the immediate detector zones and all the deferred detector zones together respectively. This "chessboard" layout gives better symmetry in all directions than the fingered structure.

The shadow mask blocking the incident light partially can be made of metal. For example, in standard CMOS one can choose metal2 for the purpose of masking. In that case, masking is achieved by reflection, the reflected light being lost for the detector. If the light source generating the light pulse is a laser, the light reflected on the detector may couple partially back into the laser and cause laser-instability.

Figure 11:
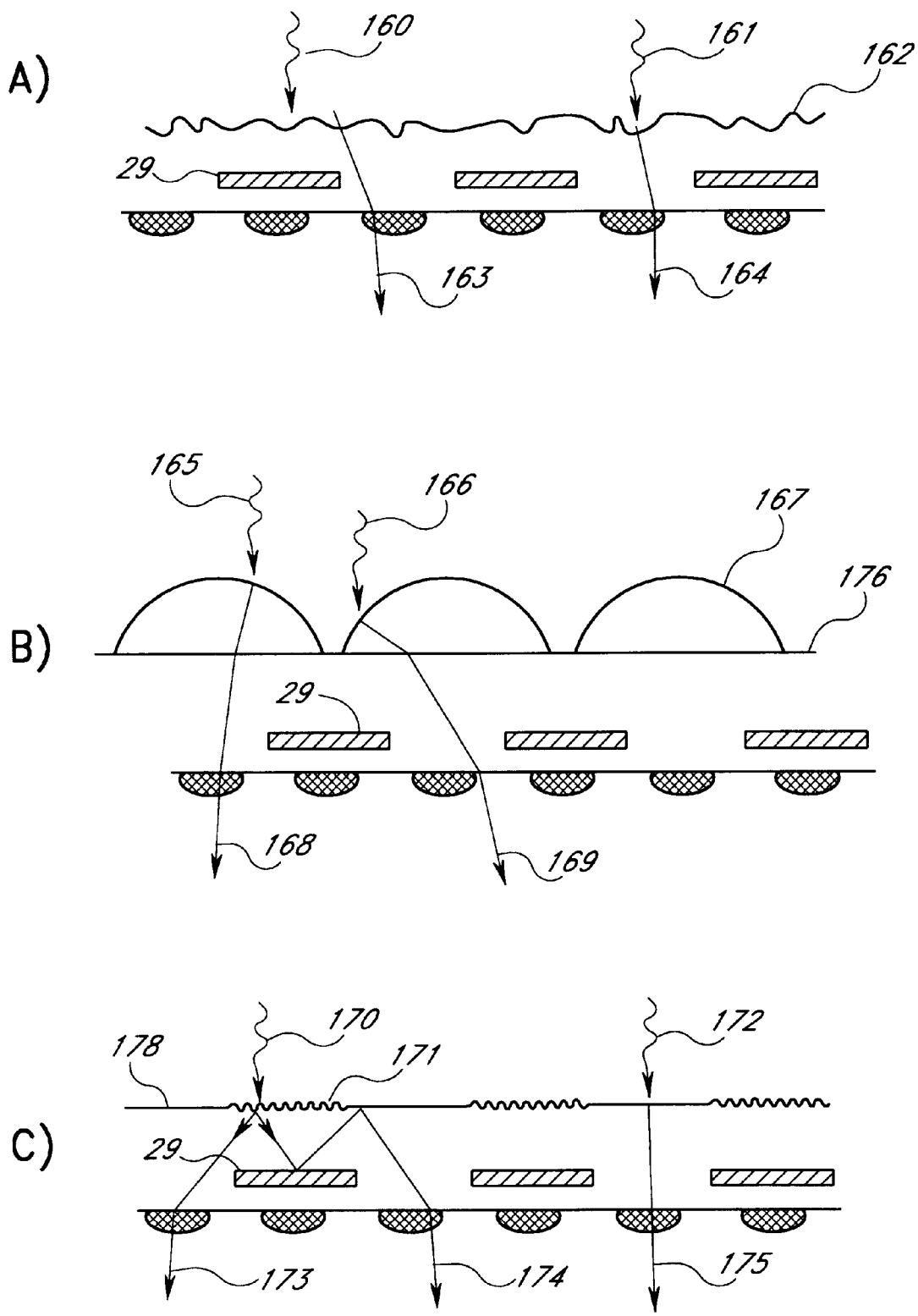

For higher responsivity, three recycling options are given in FIG. 11.

The first set-up represented by FIG. 11A requires that the top of the detector area is roughened by a natural etch. When using CMOS, the top passivation layer can be roughened in this way. A photon 160 incident above shadow metal 29, will enter the zone between the roughened surface 162 and shadow metal 29, and it will bounce between the surfaces 162 and 29 until it reaches the semiconductor surface, which, with its higher index of refraction will easily absorb the photon. Trajectory 163 shows a possible way for photon 160. The roughened surface 162 allows the direction of the photon to be altered at every bounce, and lowers the out-coupling probability of the photon. Photon 161 is incident at an immediate area and its trajectory 164 shows how it gets into the semiconductor substrate as well. In this way, it is expected that the responsivity of the detector of this invention is improved by more than 50%. The little light that is reflected even with having this roughened surface will be scattered in all directions, avoiding aforementioned laser instability.

The second set-up is represented by FIG. 11B, and requires that the top of the detector area is covered with microlenses. These can be obtained by reflow of photoresist, as is known, for example in EP 0753765, incorporated herein by reference, on top of the passivation layer 176 of CMOS. If no passivation or dielectric layer is present, a layer can be added by ways known in literature, including spin-coating. Above every immediate detector area, a lens is present, reaching over the adjacent deferred regions. A photon entering the lens, be it above an immediate region (photon 165) or above a deferred region (photon 166), its path will be essentially redirected towards an immediate or direct region. Trajectory 168 and 169 serve to demonstrate this redirection respectively. When working with a fingered structure, cylindrical lenses will work best, while the chessboard pattern layout is served best by spherical lenses. Adjacent lenses should leave as little room between them as possible, since light entering in-between microlenses will not be recovered.

The third set-up is represented by FIG. 11C, and requires that at least on top of the deferred detector regions, a grating is etched. This can be done in the top-dielectric layer, such as in the passivation layer present in CMOS. Light 170 entering grating 171 gets diverted into one or more directions, different from incident direction. In the example given, two directions are followed, both ending finally in immediate semiconductor regions (trajectories 173 and 174). Light 172 entering initially on an immediate region, gets into the immediate semiconductor zone without redirection.

Measurements have been performed on a detector fabricated following the principles of this invention, and on this detector in connection with the digital synchronous receiver. The detector had three immediate fingers and three deferred fingers. The deferred fingers were covered by metal2 with a finger width of 12 micron, serving as shadow mask. Fingers had a width of 8 micron, on a pitch of 12 micron, in a technology from AMS, of 0.8 micron. The total detector area is about 70×70 micron$^2$. The n-well depth was about 3.5 micron. The measured results refer to the effective current, being the difference of the immediate and the deferred detector current. The measured responsivity was 0.05 A/W for light with a wavelength of 860 nm and 0.132 A/W for red light (635 nm). This corresponds to a quantum efficiency of 6.9% and 25% respectively.

FIG. 12 shows the dynamic response, which is flat and levels of at the 3-dB bit-rate. For 860-nm (curve 181) the 3-dB bit-rate is 300 Mbit/s, and for 635-nm (curve 180) it is 510 Mbit/s. These bitrates are already high enough for use in many applications. A higher 3-dB bitrate can be obtained by using a shorter finger pitch.

The detector has an extreme low capacitance value (50 fF at 3.8 V from foundry measured parasitic area and perimeter capacitance values) which makes that the readout voltage is good even when taking the non-ideal quantum efficiency into account.

Curve 182 of FIG. 13 shows the mean average light power to get the synchronous receiver running, with 860 nm input light. 180 Mbit/s can be achieved easily with 860 nm light. The bitrate is limited here by the receiver, and not by the detector (since the detector works up to 300 Mbit/s). This is slightly below the expected 200 Mbit/s from simulations. At 155 Mbit/s about 5.5 microwatt average light power suffices to let the receiver operate well, with any arbitrary incident bit-sequence.

A special receiver experiment was conducted to demonstrate the most difficult bit-sequence: i.e. many "0"s followed by one "1" and many "1"s followed by one "0".

Therefore the sensitivity to receive a "1" after up-to 3000 "0"s has been measured, and was found to be the same. Conversely, 3000 times a "1" did not affect the reception of a following "0".

What is claimed is:

1. A detector for radiation with a time-dependent amplitude, comprising:
   a semiconductor substrate wherein said radiation is being absorbed, the radiation being absorbed in said substrate being spatially modulated such that said radiation thereby creates at least a first signal and a second signal in said detector; and
   a frequency-sensitive circuit for comparing the time behavior of said first and said second signal, to thereby define a detector output signal.

2. The device as recited in claim 1, wherein said radiation has at least a MHz frequency and said detector output signal has at least a MHz frequency.

3. The detector as recited in claim 1, wherein said radiation creates charge carriers in said substrate, the density of charge carriers being generated in said substrate by said radiation being modulated according to a spatial mask blocking at least one region of said substrate such that said radiation is substantially attenuated in said region.

4. The detector as recited in claim 3, wherein said first signal is at least partly determined by charge carriers being directly generated by said radiation and wherein said second signal is essentially determined by charge carriers being generated in said substrate and having diffused to said regions.

5. The detector as recited in claim 3, wherein said spatial mask has at least one radiation blocking part and at least one radiation passing part.

6. The detector as recited in claim 5, wherein the radiation blocking parts and the radiation passing parts are alternating.

7. The detector as recited in claim 6, wherein at least part of the alternating parts are in a chessboard configuration.

8. The detector as recited in claim 3, further comprising:
   at least a first region and at least a second region in said semiconducting substrate, said first and said second region being adapted for collecting charge carriers being generated in said substrate and in said regions by said radiation, said mask substantially blocking the generation of said charge carriers in said second region, the charge carriers being generated in said substrate by said radiation and being collected in said second region thereby essentially being charge carriers having diffused to said second region; and
   said circuit being connected to said first and said second region, and wherein the charge carriers being generated in said first region have a first response and the charge carriers being generated in said second region have a second response, said circuit having a functionality of comparing the time behavior of said first and said second response.

9. The detector as recited in claim 8, wherein said second response is subtracted from said first response, the resulting pulse being processed in peripheral circuitry.

10. The device as recited in claim 9, wherein said first region and said second region are forming diodes with said substrate, said substrate having dopants of one conductivity type, said first region and said second region having dopants of another conductivity type.

11. The device as recited in claim 10, wherein said radiation is electromagnetic radiation with a wavelength in the range of Ultra-Violet light to Infra-Red light, said first region and said second region being p-type regions in a n-type silicon substrate or n-type regions in a p-type silicon substrate.

12. The detector as recited in claim 9, wherein said circuit is configured as a digital synchronous receiver.

13. The detector as recited in claim 12, wherein said circuit comprises a voltage supply for applying about the same voltage on said first and said second region, a radiation pulse impinging on said first region creating a voltage difference between said first and said second region, said difference being converted to a digital signal, said digital signal being transferred to said peripheral circuitry at a moment being determined by a clock.

14. The detector as recited in claim 13, wherein said peripheral circuitry, said circuit and said substrate are integrated in a silicon chip.

15. The detector as recited in claim 9, wherein said circuit is configured as a digital asynchronous receiver.

16. The detector as recited in claim 15, wherein said circuit comprises a differential transimpedance amplifier and a comparator, said comparator sensing the difference in voltage at the output nodes of said transimpedance amplifier, said difference being determined by a radiation pulse impinging on said first region and creating a first signal in said first region and a second signal in said second region, said difference being transferred to said peripheral circuitry.

17. The detector as recited in claim 16, wherein said peripheral circuitry, said circuit and said substrate are integrated in a silicon chip.

18. The detector as recited in claim 1, wherein said radiation creates charge carriers in said substrate and further comprising:
   a plurality of first regions and second regions in said semiconducting substrate, said first and said second regions being adapted for collecting charge carriers being generated in said substrate and said regions by said electromagnetic radiation;
   a mask substantially blocking the generation of said charge carriers in said second regions, the charge carriers being generated in said substrate by said electromagnetic radiation and being collected in said second regions thereby being charge carriers having diffused to said second regions; and
   said circuit being connected to said first and said second regions, and wherein the charge carriers being generated in said first regions have a first response and the charge carriers being generated in said second regions have a second response, said means being adapted for comparing said first and said second response.

19. The detector as recited in claim 3, further comprising means to redirect the radiation incident on said mask to the part of said substrate being unblocked by said mask.

20. The detector as recited in claim 19, wherein said radiation is light in the UV to IR range and wherein said means comprise micro-lenses.

21. The detector as recited in claim 1 further comprising means for connecting or abutting at least one image fiber to said detector.

22. The detector as recited in claim 21 wherein said means comprise an optical face plate deposited on said semiconductor.

23. A method for detecting a high frequency radiation in a detector being integrated in a substrate having a first and a second region comprising the steps of:

covering said second region with a mask substantially blocking said radiation;

collecting in said first region charge carriers being generated in said first region and in said substrate by said radiation, thereby creating a first signal;

collecting in said second region charge carriers being generated in said substrate by said radiation, said mask substantially blocking the generation of said charge carriers in said second region thereby the charge carriers being collected in said second region essentially being charge carriers having diffused to said second region, thereby creating a second signal; and subtracting in a frequency-sensitive circuit said first signal from said second signal.

* * * * *